United States Patent [19]

Warwick

[11] 3,760,233

[45] Sept. 18, 1973

[54] PRINTED CIRCUIT CARD GUIDE

[75] Inventor: James S. Warwick, Minneapolis, Minn.

[73] Assignee: Sperry Rand Corporation, New York, N.Y.

[22] Filed: Mar. 27, 1972

[21] Appl. No.: 238,523

[52] U.S. Cl. .......................... 317/101 DH, 211/41

[51] Int. Cl. .......................................... H02b 1/02

[58] Field of Search .................. 211/41; 317/101 R, 317/101 DH; 339/17 LM, 17 M

[56] References Cited

UNITED STATES PATENTS

| | | | |
|---|---|---|---|
| 3,247,424 | 4/1966 | Kossoy et al. | 317/101 DH |
| 3,098,177 | 7/1963 | Bleier et al. | 317/101 DH |
| 3,673,669 | 7/1972 | Edstrom et al. | 317/101 DH |

*Primary Examiner*—David Smith, Jr.
*Attorney*—Kenneth T. Grace et al.

[57] ABSTRACT

A device for guiding and supporting a printed circuit card incorporating electronic circuitry is disclosed. The device is of a long, narrow, rectangular form and is formed of a single sheet having a series of tabs formed on the four sides. Two separate devices are required to support each edge of the printed circuit card; the two devices are mounted parallely side-by-side on a suitable support member with the spacing between adjacent devices determined by the thickness of the supported card and the compressive strength of the opposing flanges of the two adjacent devices that make compressive contact with the card. Also provided are angulated flanges on the narrow ends of the device for guiding the inserted card between the compressively opposing flanges. The device may be formed of heat conductive and/or electrically conductive materials to function as a heat sink coupling means and/or as a ground/voltage bus for side-entry of printed circuit cards.

7 Claims, 5 Drawing Figures

PRINTED CIRCUIT CARD GUIDE

BACKGROUND OF THE INVENTION

The invention herein described was made in the course of or under a contract or subcontract thereunder with the Department of the Air Force.

The present invention relates to the electronic packaging art and in particular to means for compressively restraining printed circuit cards while in operative condition yet permitting sliding assembly and disassembly without the need for attaching hardware. Prior art arrangements — see the J. Custer U.S. Pat. No. 3,193,316 — have included opposing parallel side members having opposing grooves or slots that function as a printed circuit card guide during insertion and removal of the printed circuit card into and from a printed circuit card electrical connector that is mounted in a base member orthogonally attached to the side members. Such grooves have, of necessity, loosely restrained the printed circuit card for ease of insertion and removal. Other arrangements have proposed replacing the opposing grooves by providing opposing raised strips — see the L. Novet U.S. Pat. No. 3,382,476 — or by providing demountable track elements having bent resilient finger elements for guidingly receiving and gripping the printed circuit cards — see the A. Calabro U.S. Pat. No. 3,231,785. However, some prior art arrangements have not permitted using the printed circuit card guide for both compressively restraining the printed circuit card and coupling electrical voltage/ground leads on the printed circuit card to the supporting structure while additionally transferring printed circuit card generated heat to a heat sink — see H. Kamei, et al., U.S. Pat. No. 3,268,772.

In the W. Edstrom, et al., U.S. Pat. No. 3,673,669 there is provided a printed circuit card guide for permitting side-entry of the printed circuit card, i.e., insertion and the removal of the printed circuit card along the longitudinal axis of the open face of the printed circuit card electrical connector. That device consists of two sheet members of which a plurality of tabs and associated openings are formed. The two sheet members are then reversely oriented in a superposed, parallel, planar manner with individual tabs of the first sheet member passing through the corresponding openings in the second sheet member. Pairs of opposing tabs, one tab of each of the first and second sheet members, are thus formed having a nominal separation determined by the thickness of the printed circuit card that is to be passed therebetween. Thus, each configuration of that device is specifically designed to accommodate a plurality of printed circuit cards of predetermined thicknesses as established by the separations of the opposing tabs. In contrast, in the present invention different thickness printed circuit cards may be accommodated by merely providing the desired separation between adjacent separate devices upon assembly to the supporting side wall member.

SUMMARY OF THE INVENTION

The present invention provides a novel device for permitting side-entry of printed circuit cards, i.e., insertion and removal of the printed circuit card along the longitudinal axis of the open face of the printed circuit card electrical connector, of varying thicknesses in contrast to the usual prior art means that required top-entry of the printed circuit card, i.e., insertion and removal of the printed circuit card along an axis that is normal to the open face of the printed circuit card electrical connector. Further, applicant's novel device may concurrently function as a mechanical guiding and restraining means, as an electrical coupling means and as a heat transfer means.

The novel device of the present invention has a long, narrow, rectangular form and is formed of a single sheet having a series of tabs formed on the four sides. The tabs on the two long sides are bent up at an angle less than 90° to form an open structure while tabs on each of the narrow ends are bent back on themselves to form a closed structure. In use, the devices are assembled to a supporting side wall structure in a parallel side-by-side relationship having a separation therebetween that is determined by the thickness of the to-be-supported printed circuit card which is inserted from the narrow end between the two opposing adjacent relatively long side flanges along the longitudinal axis of the adjacent devices. The two opposing pairs of flanges, because of the bend angle, secure the supported printed circuit card in a compressive grip while permitting ease of removal along the longitudinal axis of the adjacent devices. The device may be formed of many materials: electrically insulative material functioning as an insulative guiding and restraining means for printed circuit cards; electrically conductive means for functioning as a ground/voltage coupling means for electrically coupling printed circuit card circuits to a corresponding circuit on a supporting structure; or, heat conductive means for transferring printed circuit card generated heat to a heat sink on a supporting structure.

DESCRIPTION OF THE PREFERRED EMBODIMENT

Figure 1:
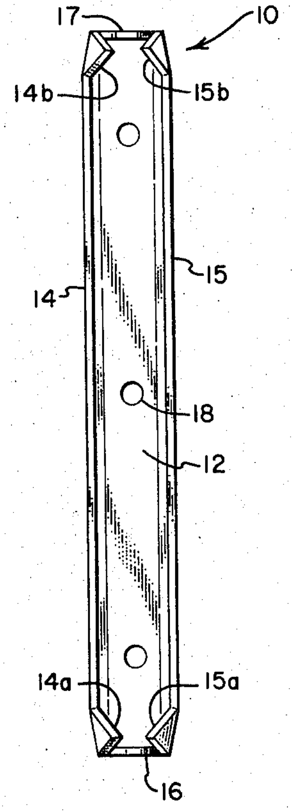
FIG. 1 is a plan view of the device of the present invention.
Figure 2:
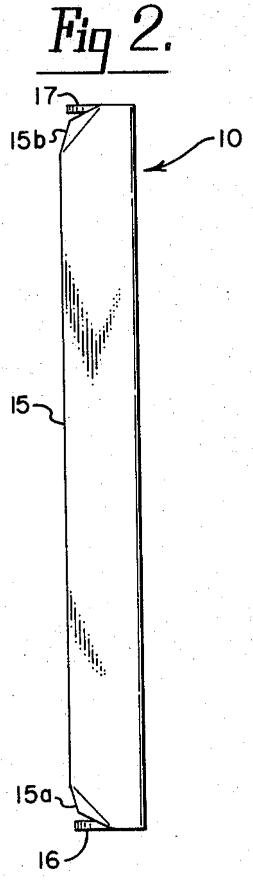
FIG. 2 is a side view of the device of FIG. 1.

With particular reference to FIGS. 1, 2 there are presented a top and a side view of the device 10 of the present invention. Device 10 consists of a 0.010 inch thick sheet of an electrically conductive material such as tin plated beryllium-copper having a plurality of flanges formed along the sides thereof. Side flanges 14, 15 are formed along the long edges of device 10 being sent upward from the base 12 thereof at an angle less than 90° and having tabs *14a*, *14b* and *15a*, *15b*, respectively, on their respective ends. Additionally, along the narrow edges of device 10 are formed flanges 16 and 17 that are bent up from the base 12 thereof at approximately 90°. End flange 16 and the associated tabs *14a* and *15a* of side flanges 14 and 15, respectively, form an approximately closed structure for preventing the passage of a printed circuit card into the open structure formed by side flanges 15 and 16. Additionally illustrated are a plurality of holes 18 in the base thereof for securing device 10 to an appropriate supporting structure.

Figure 3:
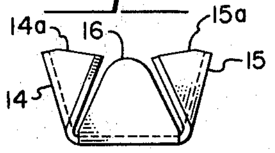
FIG. 3 is an enlarged end view of the device of FIG. 1.

With particular reference to FIG. 3 there is presented an enlarged illustration of an end view of device 10 of FIG. 1. This figure illustrates the substantially closed structure formed at the end of device 10 by end flange 16 and the tabs 14*a* and 15*a* of side flanges 14 and 15, respectively. Also illustrated is the angulation of the side flanges 14 and 15 with respect to the base member of device 10, which angulation is at an angle of approximately 77° for compressively permitting side flanges 14 and 15 to be moved inwardly upon side pressure being applied thereto.

Figure 4:
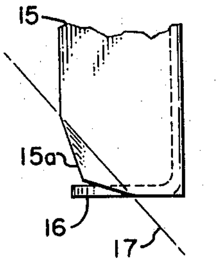
FIG. 4 is an enlarged side view of one end of the device of FIG. 2.

With particular reference to FIG. 4 there is presented an enlarged illustration of a side view of the bottom end of the device 10 of FIG. 2. This illustration, along with that of FIG. 3, particularly illustrates the relationship of the side flange 15 and its tab 15*a* — bent along a bend line 17 at an angle of approximately 45° to the plane of the base 12 — with end flange 16 for forming a substantially closed structure while yet permitting inward movement of the side flange 15.

Figure 5:
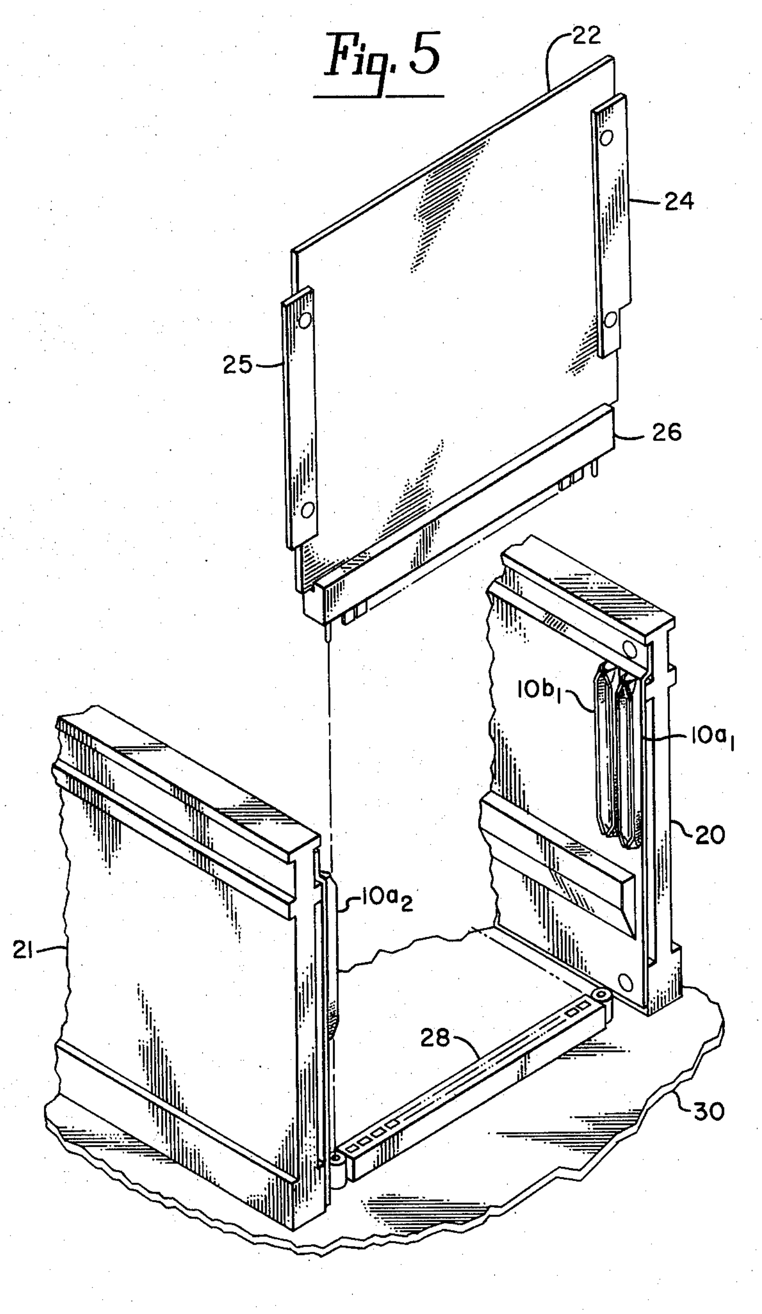
FIG. 5 is an isometric view of a plug-in module incorporating the device of the present invention.

With particular reference to FIG. 5 there is presented an isometric view of a plug-in module incorporating the device of the present invention. In this illustrated application a plurality of devices $10a_1$, $10b_1$ are assembled in a parallel side-by-side relationship upon a supporting side wall member 20. In a like manner, devices $10a_2$ and $10b_2$ are assembled on the inside surface of a corresponding supporting side wall member 21. Printed circuit card 22 has two opposing side members 24 and 25 and a top-entry electrical connector 26 which upon installation makes the appropriate electrical connections with electrical receptacle 28 secured to base member 30.

For installation of electrical connector 26 into electrical receptacle 28, side flange 24 is aligned with the opening between the opposing adjacent side flanges of devices $10a_1$ and $10b_1$ while side member 25 is aligned with the opening between opposing adjacent side flanges of devices $10a_2$ and $10b_2$ on the inside face of supporting wall member 21. Side members 24 and 25 are then forced into the opening between the opposing adjacent flanges of the associated devices 10 which opposing adjacent flanges guide the connector 26 into the mating receptacle 28. While the connector 26 and the receptacle 28 are in their coupled condition the opposing adjacent flanges of the associated devices 10 provide a sufficient compressive grip upon the associated side members 24 and 25 to ensure the secure installation of printed circuit card 22 and the desired electrical connection between connector 26 and receptacle 28.

It is thus seen that the opposing adjacent side flanges of the two adjacent parallel side-by-side devices 10, both assembled to a supporting structure to have a nominal separation that is determined by the nominal thickness of the printed circuit card that is to be passed therethrough, function as a side-entry card guide for maintaining secure electrical connections between a printed circuit card, connector and a mating receptacle, as a means for conducting heat from the printed circuit card to a heat sink on the supporting structure, and as a means for coupling a voltage/ground source on the printed circuit card to the supporting structure.

What is claimed is:

1. A device for forming a side-entry card guide, comprising a sheet member having;
- a long, narrow, rectangular supporting base;
- end flanges formed on each of said narrow edges and bent up from the plane of said supporting base;
- side flanges formed on each of said long edges and bent up from the plane of said supporting base;
- each of said side flanges having on the ends thereof tabs bent in toward the associated end flange for forming a substantially closed structure at each end.

2. The device of claim 1 in which said side flanges are bent up from the plane of said supporting base at approximately 77°.

3. The device of claim 1 in which said end flanges are bent up from the plane of said supporting base at approximately 90°.

4. The device of claim 1 in which said sheet member is of a heat and electrically conductive material.

5. The device of claim 1 in which said tabs are bent along a bend line that is at approximately 45° to the plane of said supporting base.

6. A plug-in module for the side-entry of a printed circuit card, comprising:
- two parallel spaced-apart wall members assembled in a substantially fixed relationship;
- a plurality of side-entry card guides according to claim 1, two of said card guides assembled on the opposing sides of each of said wall members in a parallel spaced-apart side-by-side relationship for compressively securing opposing edges of a printed circuit card that is to be inserted between the opposing adjacent spaced-apart side flanges of said two card guides.

7. A plug-in module for the side-entry of a printed circuit card, comprising:
- a base member;
- two parallel spaced-apart wall members assembled in a substantially perpendicular relationship with said base member;
- a top-entry electrical receptacle secured to said base member;
- a plurality of side-entry card guides according to claim 1, two of said card guides assembled on the opposing sides of each of said wall members in a parallel spaced-apart side-by-side relationship for compressively securing opposing edges of a printed circuit card that is to be inserted between the opposing adjacent spaced-apart side flanges of said two card guides and into said electrical receptacle.

* * * * *

UNITED STATES PATENT OFFICE
CERTIFICATE OF CORRECTION

Patent No. 3,760,233 Dated September 18, 1973

Inventor(s) JAMES S. WARWICK

It is certified that error appears in the above-identified patent and that said Letters Patent are hereby corrected as shown below:

Claim 1, column 4, lines 7 and 8, after "comprising" insert -- : --

Claim 1, column 4, line 8, " a sheet member having" should be carried to the next line and indented as the first and main paragraph of claim 1.

Claim 1, column 4, lines 9 through 17, the following paragraphs should be double indented as subparagraphs of the main paragraph on line 8, "a sheet member having;" on line 9, " a long,...base, on lines 10 and 11, "end flanges...base;", on lines 12 and 13, "side flanges ...base;", and on lines 14 through 17, "each of said...end.".

Signed and sealed this 13th day of August 1974.

(SEAL)
Attest:

McCOY M. GIBSON, JR.
Attesting Officer

C. MARSHALL DANN
Commissioner of Patents